(12) United States Patent
Kuo et al.

(10) Patent No.: US 11,215,929 B2
(45) Date of Patent: Jan. 4, 2022

(54) PHOTORESIST SYSTEM AND METHOD

(71) Applicant: Taiwan Semiconductor Manufacturing Company, Ltd., Hsinchu (TW)

(72) Inventors: Hung-Jui Kuo, Hsinchu (TW); De-Yuan Lu, Taipei (TW); Chen-Hua Yu, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 167 days.

(21) Appl. No.: 16/228,977

(22) Filed: Dec. 21, 2018

(65) Prior Publication Data

US 2020/0133128 A1    Apr. 30, 2020

Related U.S. Application Data

(60) Provisional application No. 62/752,426, filed on Oct. 30, 2018.

(51) Int. Cl.
*G03F 7/16*    (2006.01)

(52) U.S. Cl.
CPC .................................. *G03F 7/168* (2013.01)

(58) Field of Classification Search
CPC ............... G03F 7/168; G03F 7/16; G03F 7/38
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2008/0185370 A1* | 8/2008 | Fukuoka .............. F27B 17/0025 219/385 |
| 2018/0117641 A1* | 5/2018 | Jung .................... H01L 21/6715 |

* cited by examiner

*Primary Examiner* — Daborah Chacko-Davis
(74) *Attorney, Agent, or Firm* — Slater Matsil, LLP

(57) ABSTRACT

A photoresist apparatus and a method are provided. The photoresist apparatus includes a pre-baking apparatus. The pre-baking apparatus includes: a hot-plate, a first cover over the hot-plate, a second cover over the first cover, a first heating element extending along a topmost surface of the first cover, and a second heating element extending along a topmost surface of the second cover.

20 Claims, 9 Drawing Sheets

PHOTORESIST SYSTEM AND METHOD

PRIORITY CLAIM AND CROSS-REFERENCE

This application claims the benefit of U.S. Provisional Application No. 62/752,426, filed on Oct. 30, 2018, which application is hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing have been necessitated in order to keep up the ability to scale down the devices, and further improvements are needed in order to meet the desired design criteria such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
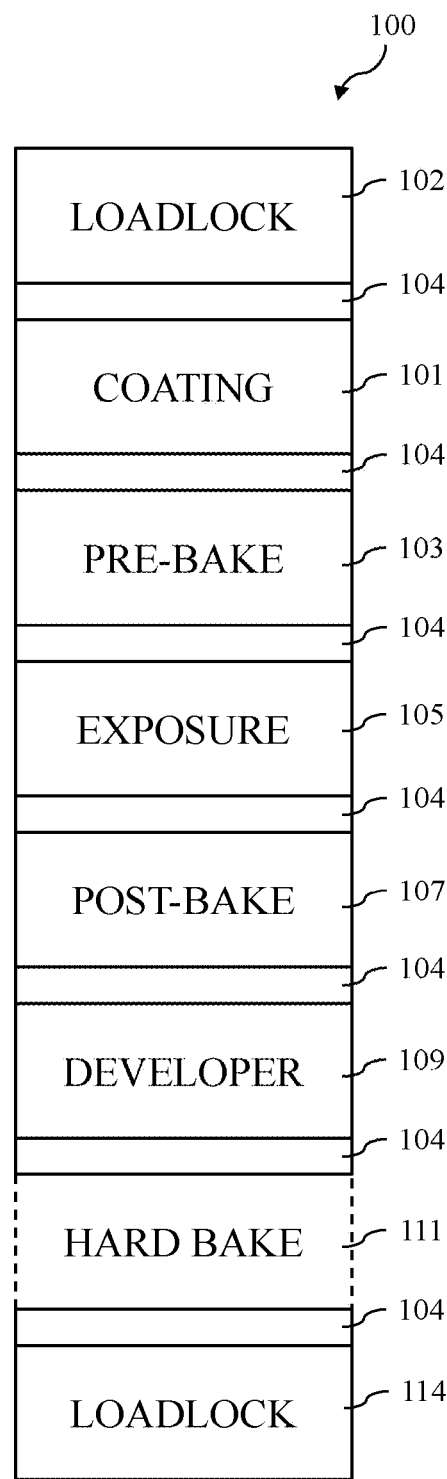
FIG. 1 illustrates a photoresist track system in accordance with some embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a photoresist system and a photoresist process utilized in the manufacturing of semiconductor devices. Other embodiments may also be applied, however, to other manufacturing processes. Various embodiments presented herein provide a pre-development bake station/apparatus that avoids condensation of a photoresist solvent vapor on walls of the pre-development bake station/apparatus. In some embodiments, the condensation of the photoresist solvent vapor is avoided by eliminating cold regions in the pre-development bake station/apparatus. Various embodiments allow for reducing or avoiding defects in the photoresist due to the condensed solvent and eliminating a need for cleaning the pre-development bake station/apparatus to remove the condensed solvent from the walls and other components of the pre-development bake station/apparatus. Accordingly, a wafer yield is increased and an idle time of the pre-development bake station/apparatus (due to cleaning of the pre-development bake station/apparatus) is reduced or eliminated.

With reference now to FIG. 1, there is shown a photoresist track system 100 with a first loadlock chamber 102, a coating station 101, a pre-bake station 103, an exposure station 105, a post-bake station 107, a developer station 109, an optional hard bake station 111, a plurality of transfer chambers 104, and a second loadlock chamber 114. In some embodiments, the photoresist track system 100 is a track system for processing a substrate 201 (not illustrated in FIG. 1 but illustrated and discussed below with respect to FIG. 2B), and is a self-enclosed, fully contained system into which the substrate 201 may be initially placed. Once within the photoresist track system 100, the substrate 201 may be moved from station to station and processed without breaking the interior environment, thereby isolating the substrate 201 from the ambient environment that may contaminate or otherwise interfere with the processing of the substrate 201.

In some embodiments, the photoresist track system 100 receives the semiconductor substrate into the photoresist track system 100 through, e.g., the first loadlock chamber 102. The first loadlock chamber 102 opens to the exterior atmosphere and receives the substrate 201. Once the substrate 201 is located within the first loadlock chamber 102, the first loadlock chamber 102 can close, isolating the substrate 201 from the exterior atmosphere. Once isolated, the first loadlock chamber 102 can then have the remaining exterior atmosphere evacuated in preparation for moving the substrate 201 into the remainder of the photoresist track system 100 through, e.g., a transfer chamber 104.

The transfer chamber 104 may be one or more robotic arms (not individually illustrated in FIG. 1) that can grip, move, and transfer the substrate 201 from the first loadlock chamber 102 to, e.g., the coating station 101. In some embodiments, the robotic arms may extend into the loadlock chamber 102, grip the substrate 201, and transfer the substrate 201 into the transfer chamber 104. Once inside, the transfer chamber 104 may have doors that close to isolate the transfer chamber 104 from the loadlock chamber 102 so that the loadlock chamber 102 may again be opened to the exterior atmosphere without contaminating the remainder of the photoresist track system 100. Once isolated from the loadlock chamber 102, the transfer chamber 104 may open to the next station, e.g., the coating station 101, and the robotic arms, still holding the substrate 201, may extend into the next station and deposit the substrate 201 for further processing.

In some embodiments, the transfer chamber 104 between the first loadlock chamber 102 and the coating station 101 transfers the substrate 201 directly from the first loadlock chamber 102 into the coating station 101. However, other processing stations may be located between the loadlock chamber 102 and the coating station 101. For example, cleaning stations, temperature control stations, or any other type of station, which may be used to prepare the substrate 201 to receive a photoresist 211 (not illustrated in FIG. 1 but illustrated and discussed below with respect to FIG. 2B) may alternatively be included. Any suitable type or number of stations may be used, and all such stations are fully intended to be included within the scope of the embodiments.

Additionally, the transfer chambers 104 are illustrated in FIG. 1 as being a separate transfer chamber 104 between each of the processing stations (e.g., between first the loadlock chamber 102 and the coating station 101, between the coating station 101 and the exposure station 105, etc.). However, this is intended to be illustrative and is not intended to be limiting upon the embodiments. The precise number of transfer chambers 104 will depend at least in part upon the overall structural layout of the various process stations. For example, if the process stations are arranged in a linear fashion (as illustrated in FIG. 1), then there may be a transfer chamber 104 between each station. However, in other embodiments in which the various process stations or groups of process stations are arranged, e.g., in one or more circles, then a single transfer chamber 104 may be utilized to move the substrates being processed (e.g., the substrate 201) into and out of the various process stations. All such arrangements are fully intended to be included within the scope of the embodiments.

Figure 2A:
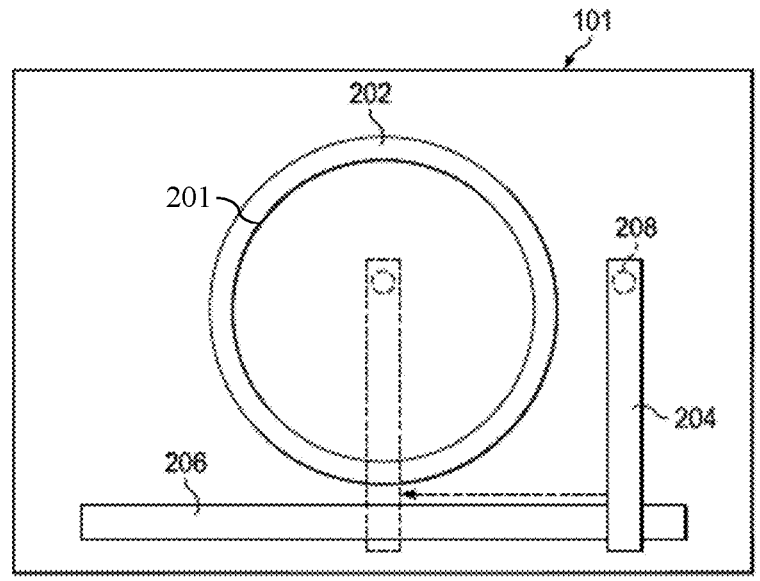
FIGS. 2A and 2B illustrate an application of a photoresist in accordance with some embodiments.
Figure 2B:
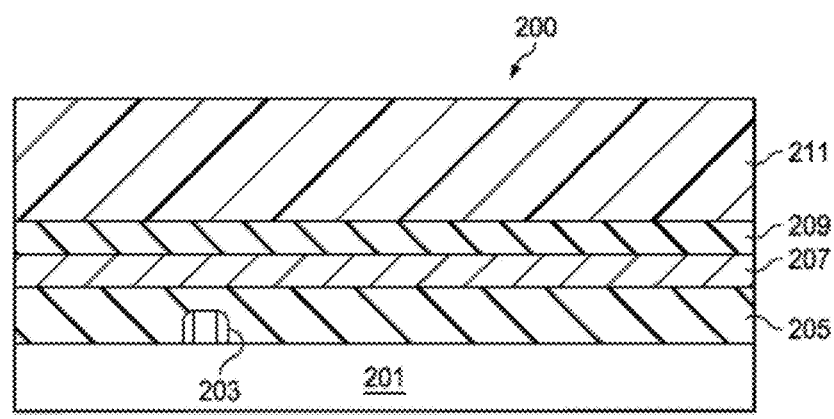

FIG. 2A illustrates a top-down view of the coating station 101 into which the transfer chamber 104 places the substrate 201, with FIG. 2B illustrating a cross-sectional view of the substrate 201 after being processed within the coating station 101 in accordance with some embodiments. In some embodiments, the coating station 101 is a spin-on station and comprises a rotating chuck 202, a dispensing arm 204, and a track 206. The rotating chuck 202 receives the substrate 201 from the transfer chamber 104 and holds the substrate 201 during processing. In some embodiments, the rotating chuck 202 may be a vacuum chuck, electrostatic chuck, or the like.

The dispensing arm 204 has a nozzle 208 in order to dispense a photoresist 211 (see FIG. 2B) onto the substrate 201. In some embodiments, the dispensing arm 204 may be moveable relative to rotating chuck 202 so that the dispensing arm 204 can move over the substrate 201 (illustrated in FIG. 2A by the arrow and dispensing arm illustrated in dashed lines) in order to evenly dispense the photoresist 211. The dispensing arm 204 may move back and forth with the help of the track 206, which provides a fixed reference to assist the dispensing arm 204 in its movement.

During operation, the rotating chuck 202, holding the substrate 201, can rotate at a speed of about 10 rpms to about 4000 rpms, although any suitable speed may be utilized. While the rotating chuck 202 is rotating, the dispensing arm 204 may move over the substrate 201 and begin dispensing the photoresist 211 onto the substrate 201 through the nozzle 208. The rotation of the substrate 201 helps the photoresist 211 to spread evenly across the substrate 201, such as to a thickness of between about 10 nm and about 100,000 nm, such as about 30,000 nm.

However, as one of ordinary skill in the art will recognize, the spin-on configuration illustrated in FIG. 2A and described above is intended to be illustrative only and is not intended to limit the embodiments. Rather, any suitable configuration for the coating station 101 that may be used to apply the photoresist 211, such as a dip coating configuration, an air-knife coating configuration, a curtain coating configuration, a wire-bar coating configuration, a gravure coating configuration, a lamination configuration, an extrusion coating configuration, combinations of these, or the like, may alternatively be utilized. All such suitable configurations for the coating station 101 are fully intended to be included within the scope of the embodiments.

FIG. 2B illustrates a semiconductor device 200 with the substrate 201 after dispensing of the photoresist 211 over the substrate 201. Also illustrated as being formed on the substrate 201 (prior to the application of the photoresist 211) are devices 203 on the substrate 201, an interlayer dielectric (ILD) layer 205 over the devices 203, metallization layers 207 over the ILD layer 205, and a target layer 209 over the ILD layer 205. In some embodiments, the target layer 209 is patterned or otherwise processed using the photoresist 211. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The devices 203 are represented in FIG. 2B as a single transistor. However, as one of skill in the art will recognize, a wide variety of devices such as capacitors, resistors, inductors, diodes, photo-diodes, fuses, and the like may be used to generate the desired structural and functional requirements of the design for the semiconductor device 200. The devices 203 may be formed using any suitable methods within or on the surface of the substrate 201.

The ILD layer 205 may comprise a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like. The ILD layer 205 may be formed by any suitable method known in the art, such as a spin-on coating method, chemical vapor deposition (CVD), plasma enhanced CVD (PECVD), low pressure CVD (LPCVD), a combination thereof, or the like. The ILD layer 205 may be formed to a thickness of between about 100 Å and about 10,000 Å.

The metallization layers 207 are formed over the substrate 201, the devices 203, and the ILD layer 205 and are designed to electrically connect the various devices 203 to form functional circuitry. While illustrated in FIG. 2B as a single layer, the metallization layers 207 are formed of alternating layers of dielectric and conductive material and may be formed through any suitable process (such as deposition, damascene, dual damascene, etc.). The number of metallization layers 207 is dependent upon the design of the semiconductor device 200.

The target layer 209 is formed over the metallization layers 207. The target layer 209 may be any layer of the semiconductor 200 that is intended to be patterned or otherwise processes using the photoresist 211. In some embodiments, the target layer 209 may be a dielectric layer of an upper metallization layer of the metallization layers 207. In such embodiments, the target layer 209 is pattered to form openings for conductive features (such as conductive lines and vias) of the upper metallization layer of the metallization layers 207. In other embodiments, the target layer 209 may be an ILD layer, such as, for example, the ILD layer 205. In such embodiments, the metallization layers 207 are omitted, the target layer 209 is directly formed on the substrate 201 and is patterned to form openings for conductive contacts, which provide electrical connection to the devices 203.

The photoresist 211 is applied to the target layer 209 using the coating station 101 (see FIG. 1). In some embodiments, the photoresist 211 includes a polymer resin along with one or more photoactive compounds (PACs) in a solvent. The individual components of the photoresist 211 may be placed into a solvent in order to aid in the mixing and placement of the photoresist 211. To aid in the mixing and placement of the photoresist 211, the solvent is chosen at least in part based upon the materials chosen for the polymer resin as well as the PACs. In particular, the solvent is chosen such that the polymer resin and the PACs can be evenly dissolved into the solvent and dispensed upon the target layer 209. Optionally, a cross-linking agent may also be added to the photoresist 211. The cross-linking agent reacts with the polymer resin within the photoresist 211 after exposure, assisting in increasing the cross-linking density of the photoresist, which helps to improve the resist pattern and resistance to dry etching.

In addition to the polymer resins, the PACs, the solvents, and the cross-linking agents, the photoresist 211 may also include a number of other additives that will assist the photoresist 211 obtain the highest resolution. In some embodiments, the additives may include surfactants, quenchers, stabilizers, dissolution inhibitors, plasticizers, coloring agents, adhesion additives, surface leveling agents, combinations thereof, or the like. The surfactants may be added in order to help improving the ability of the photoresist 211 to coat the surface on which it is applied. The quenchers may be added to inhibit diffusion of the generated acids/bases/free radicals within the photoresist 211, which helps the resist pattern configuration and improves the stability of the photoresist 211 over time. The stabilizers may be added to assist in preventing undesired diffusion of the acids generated during exposure of the photoresist 211. The dissolution inhibitors may be added in order to help control dissolution of the photoresist 211 during development. The plasticizers may be added to reduce delamination and cracking between the photoresist 211 and underlying layers (e.g., the target layer 209). The coloring agents may be added to help observers examine the photoresist 211 and find any defects that may need to be remedied prior to further processing. The adhesion additives may be added in order to promote adhesion between the photoresist 211 and an underlying layer upon which the photoresist 211 has been applied (e.g., the target layer 209). The surface leveling agents may be added in order to assist a top surface of the photoresist 211 to be level so that impinging light will not be adversely modified by an un-level surface.

In some embodiments, the polymer resin and the PACs, along with any desired additives or other agents, are added to the solvent for application. Once added, the mixture is then mixed in order to achieve an even composition throughout the photoresist 211 in order to ensure that there are no defects caused by an uneven mixing or non-constant composition of the photoresist 211. Once mixed together, the photoresist 211 may either be stored prior to its usage or else dispensed by the coating station 101 through the nozzle 208 onto the target layer 209.

Figure 3:
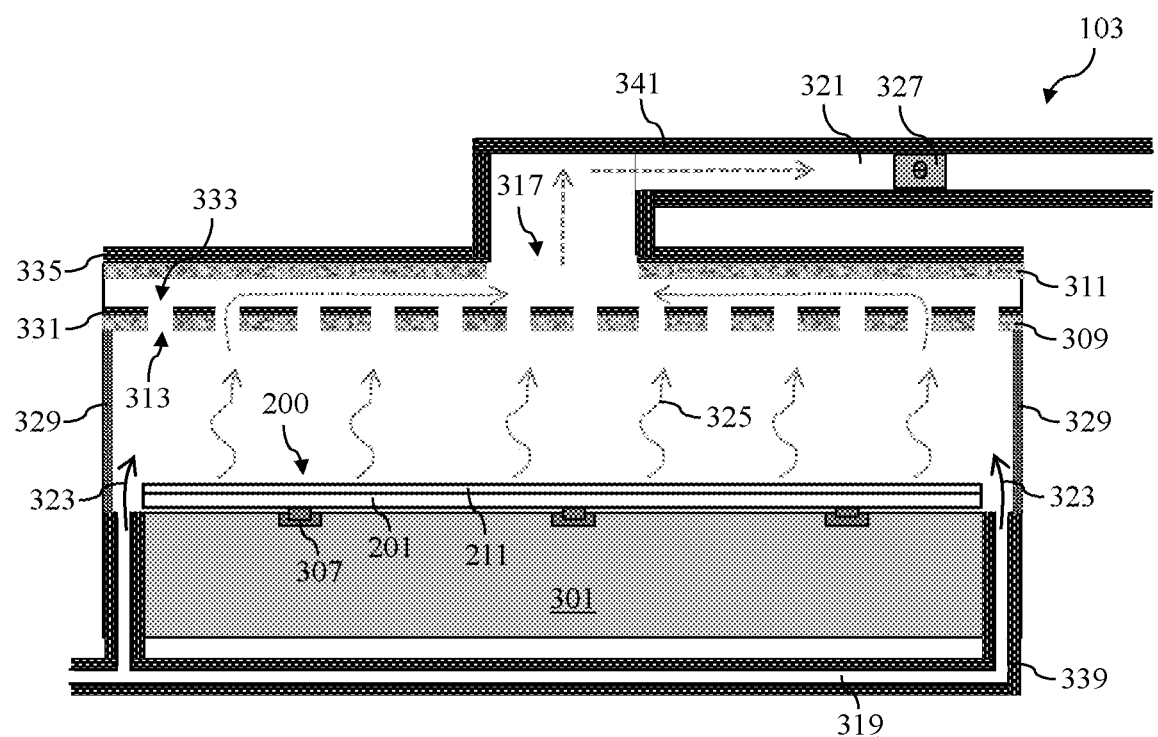
FIGS. 3-8 illustrate a pre-development baking of the photoresist in accordance with some embodiments.
Figure 4:
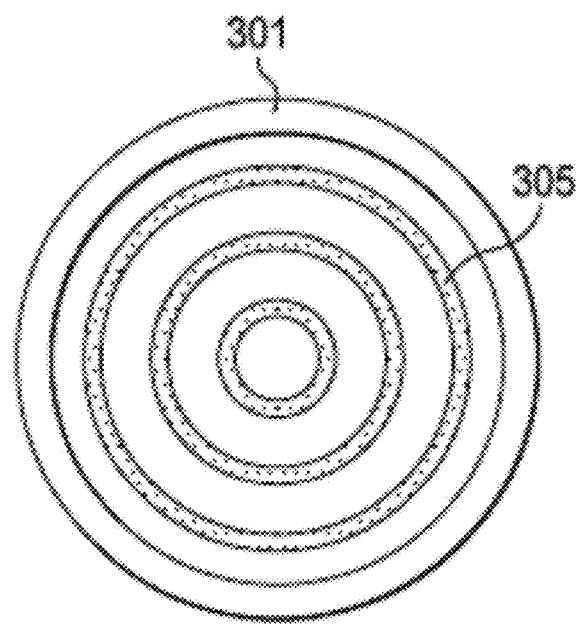

FIG. 3 illustrates a cross-sectional view of the pre-bake station 103 into which the semiconductor device 200 comprising the substrate 201 with the photoresist 211 formed thereon, may be moved (through the transfer chamber 104) once the photoresist 211 has been applied to the substrate 201. In some embodiments, the pre-bake station 103 may comprise a hot-plate 301 onto which the substrate 201 may be placed for processing. The hot-plate 301 may have a circular plan-view shape as illustrated in FIG. 4. The hot-plate 301 may comprise heating elements 305 such as resistive heating elements that raise the temperature of the hot-plate 301 and, thus, the temperature of the substrate 201 and photoresist 211 in order to cure and dry the photoresist 211 prior to exposure to finish the application of the photoresist 211. The hot-plate 301 may comprise protrusions 307 on which the substrate my rest during processing. In such embodiments, the substrate 201 may not be in direct contact with a top surface of the hot-plate and the heat from the hot-plate 301 may be transferred through an ambient atmosphere within the pre-bake station 103. In some embodiments, the hot-plate 301 may have a diameter between about 20 cm and about 45 cm.

Figure 5:
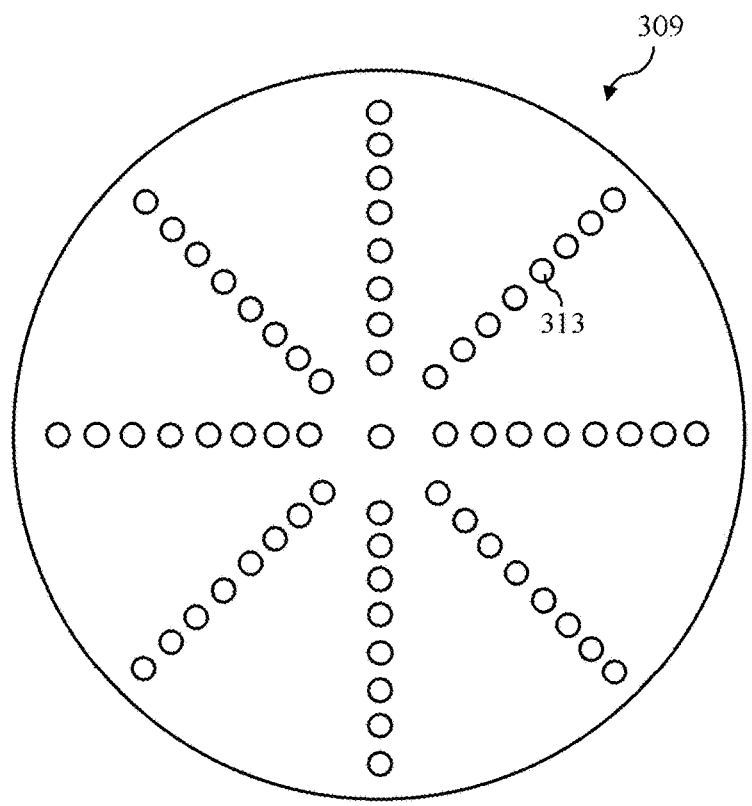

The pre-bake station 103 further comprises a first cover 309 over the hot-plate 301, and a second cover 311 over the first cover 309 such that the substrate 201 with photoresist 211 is disposed between the hot-plate 301 and the first cover 309. The first cover 309 may have a circular plan-view shape as illustrated in FIG. 5. The first cover 309 may comprise a plurality of holes 313 extending through the first cover 309. In some embodiments, the plurality of holes 313 may be arranged into a radial pattern. In other embodiments, the plurality of holes 313 may be arranged into any desired pattern based on functional requirements of the first cover 309. In some embodiments, the first cover 309 may have a diameter between about 180 mm and about 320 mm. In some embodiment, each of the plurality of holes 313 may have a diameter between about 1 mm and about 20 mm.

Figure 6:
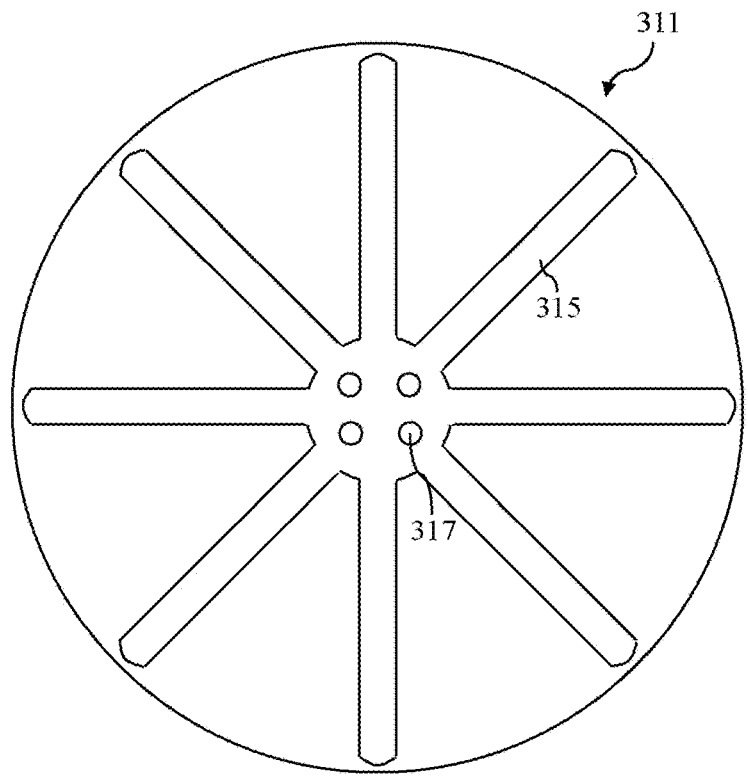

The second cover 311 may have a circular plan-view shape as illustrated in FIG. 6. In some embodiments, a diameter of the second cover 311 may be substantially equal to a diameter of the first cover 309. The second cover 311 may comprise a plurality of grooves 315 on a surface that is facing the first cover 309. In some embodiments, the plurality of grooves 315 forms a radial pattern. In some embodiments, the radial pattern of the plurality of grooves 315 is aligned with the radial pattern of the plurality of holes 313 of the first cover 309. In such embodiments, each of the plurality of grooves 315 is aligned with respective ones of the plurality of holes 313 of the first cover 309. The second cover 311 may further comprise one or more holes 317 extending through the second cover 311. In some embodiments, the one or more holes 317 are located a center of the second cover 311. In the embodiment illustrated in FIG. 6, the second cover 311 comprises four holes 317. In other embodiments, the precise number of the holes 317 may depend on the functional requirements of the second cover 311. In some embodiments, the grooves 315 may guide evaporated photoresist components flowing form the he plurality of holes 313 of the first cover 309 to the one or more holes 317 during a pre-bake process. In some embodiments, the second cover 311 may have a diameter between about 180 mm and about 320 mm. In some embodiment, each of the plurality of holes 317 may have a diameter between about 5 mm and about 50 mm.

The pre-bake station 103 further comprises one or more intake pipes 319 and one or more exhaust pipes 321. The one or more intake pipes 319 introduce air (illustrated by solid arrows 323 in FIG. 3) into the pre-bake station 103. The one or more exhaust pipes 321 are configured to evacuate volatile by-products of the pre-bake process, such as evaporated solvent components (illustrated by dashed arrows 325 in FIG. 3), from the pre-bake station 103. The one or more exhaust pipes 321 may comprise a damper 327 that is configured to vary a flow rate of the evaporated solvent components 325 though the one or more exhaust pipes 321. The pre-bake station 103 further comprises a ring shutter 329. The ring shutter 329 may move vertically up or down to allow the substrate 201 with the photoresist 211 to be transferred into the pre-bake station 103 and to seal the pre-bake station 103 from external environment after transferring the substrate 201 with the photoresist 211 into the pre-bake station 103.

In some embodiments, the pre-bake station 103 further comprises a first heating element 331 along an upper surface of the first cover 309, a second heating element 335 along an upper surface of the second cover 311, a third heating element 339 lining external surfaces of the one or more intake pipes 319, and a fourth heating element 341 lining external surfaces of the one or more exhaust pipes 321. In some embodiments, the first heating element 331, the second heating element 335, the third heating element 339, and the fourth heating element 341 may be resistive heating elements and may comprise one or more layers of suitable resistive materials, such as mica, quartz, polyimide, silicone rubber, semiconductor heater, a combination thereof, or the like. The first heating element 331, the second heating element 335, the third heating element 339, and the fourth heating element 341 raise temperatures of the first cover 309, the second cover 311, the one or more intake pipes 319, and the one or more exhaust pipes 321, respectively.

Figure 7:
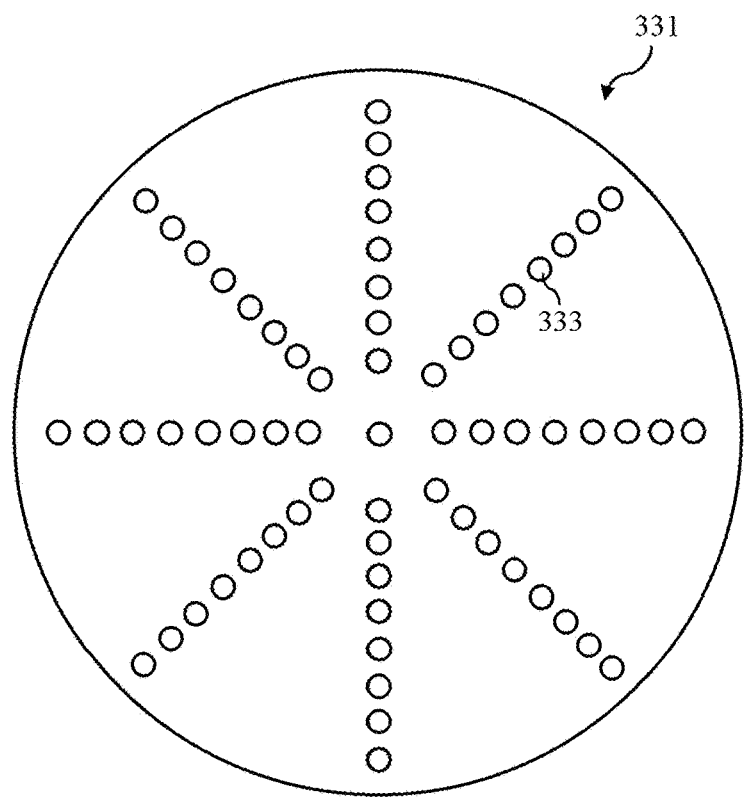

In some embodiments, the first heating element 331 may have a circular plan-view shape as illustrated in FIG. 7. The first heating element 331 may comprise a plurality of holes 333 extending through the first heating element 331. The plurality of holes 333 may be arranged into a radial pattern. In some embodiments, the first heating element 331 and the first cover 309 may have a substantially same diameter. In some embodiments, the plurality of holes 333 of the first heating element 331 and the plurality of holes 313 of the first cover 309 may have a substantially same diameter. In some embodiments, the plurality of holes 333 of the first heating element 331 and the plurality of holes 313 of the first cover 309 may be arranged into a substantially similar radial pattern. In some embodiments, each of the plurality of holes 333 of the first heating element 331 is aligned with a respective one of the plurality of holes 313 of the first cover 309.

Figure 8:
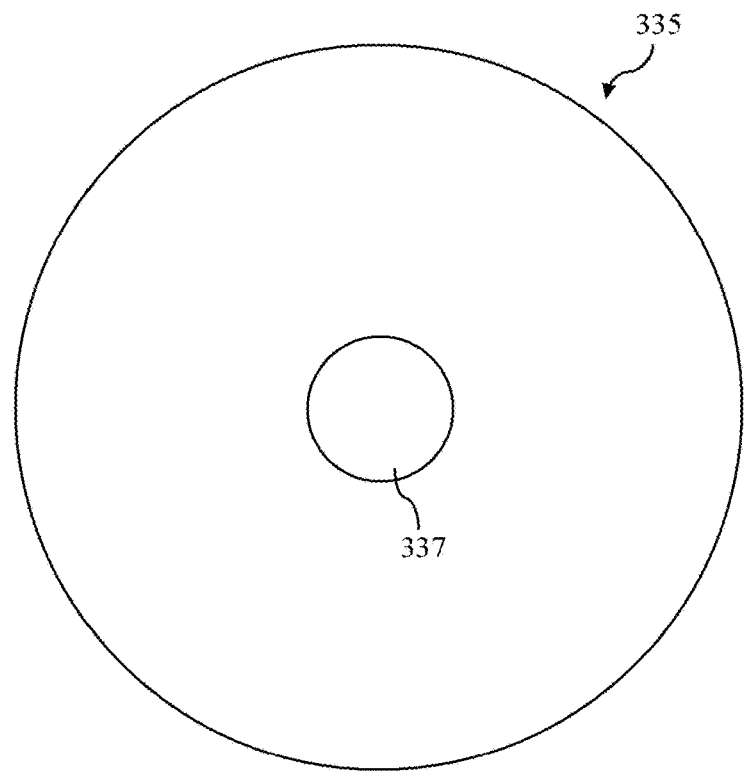

In some embodiments, the second heating element 335 may have a circular plan-view shape as illustrated in FIG. 8. The second heating element 335 may comprise a hole 337 extending through the second heating element 335 at a center of the second heating element 335. In some embodiments, a vertical portion of the one or more exhaust pipes 321 extends through the hole 337 in the second heating element 335. In some embodiments, the second heating element 335 and the second cover 311 may have a substantially same diameter. In some embodiments, the second heating element 335 may comprise a greater number of resistive layers than the first heating element 331.

After introducing the substrate 201 with the photoresist into the pre-bake station 103 and placing the substrate 201 over the hot-plate 301, the temperature of the substrate 201 and photoresist 211 is raised by the hot-plate 301 in order to cure and dry the photoresist 211 prior to exposure to finish the application of the photoresist 211. The curing and drying of the photoresist 211 removes the solvent components while leaving behind the polymer resin, the PACs, cross-linking agents, and the other chosen additives. In some embodiments, the pre-bake may be performed at a substrate temperature suitable to evaporate the solvent of the photoresist 211, such as between about 100° C. and 200° C., such as about 150° C., although the precise temperature depends upon the materials chosen for the photoresist 211. In some embodiments, the first heating element 331, the second heating element 335, the third heating element 339, and the fourth heating element 341 raise temperatures of the first cover 309, the second cover 311, the one or more intake pipes 319, and the one or more exhaust pipes 321, respectively, to a temperature between about 150° C. and 250° C., such as about 200° C. In some embodiments, during the pre-bake process, the first heating element 331, the second heating element 335, the third heating element 339, and the fourth heating element 341 may have a same temperature. In other embodiments, during the pre-bake process, the first heating element 331, the second heating element 335, the third heating element 339, and the fourth heating element 341 may have different temperatures. In some embodiments, during the pre-bake process, the temperatures of the first heating element 331, the second heating element 335, the third heating element 339, or the fourth heating element 341 are greater than the temperature of the substrate 201 and the photoresist 211. The pre-bake process is performed for a time sufficient to cure and dry the photoresist 211, such as between about 10 seconds to about 10 minutes, such as about 300 seconds.

In some embodiments, the evaporated solvent components 325 flow through the holes 313 of the first cover 309, the holes 333 of the first heating element 331, the holes 317 of the second cover 311, and are evacuated from the pre-bake station 103 through the one or more exhaust pipes 321. By raising the temperatures of the first cover 309, the second cover 311, the one or more intake pipes 319, or the one or more exhaust pipes 321, cold regions of the pre-baking station 103 are reduced or eliminated. Accordingly, condensation of the evaporated solvent components 325 is reduced or avoided on the first cover 309, the second cover 311, the one or more intake pipes 319, or the one or more exhaust pipes 321.

Figure 9:
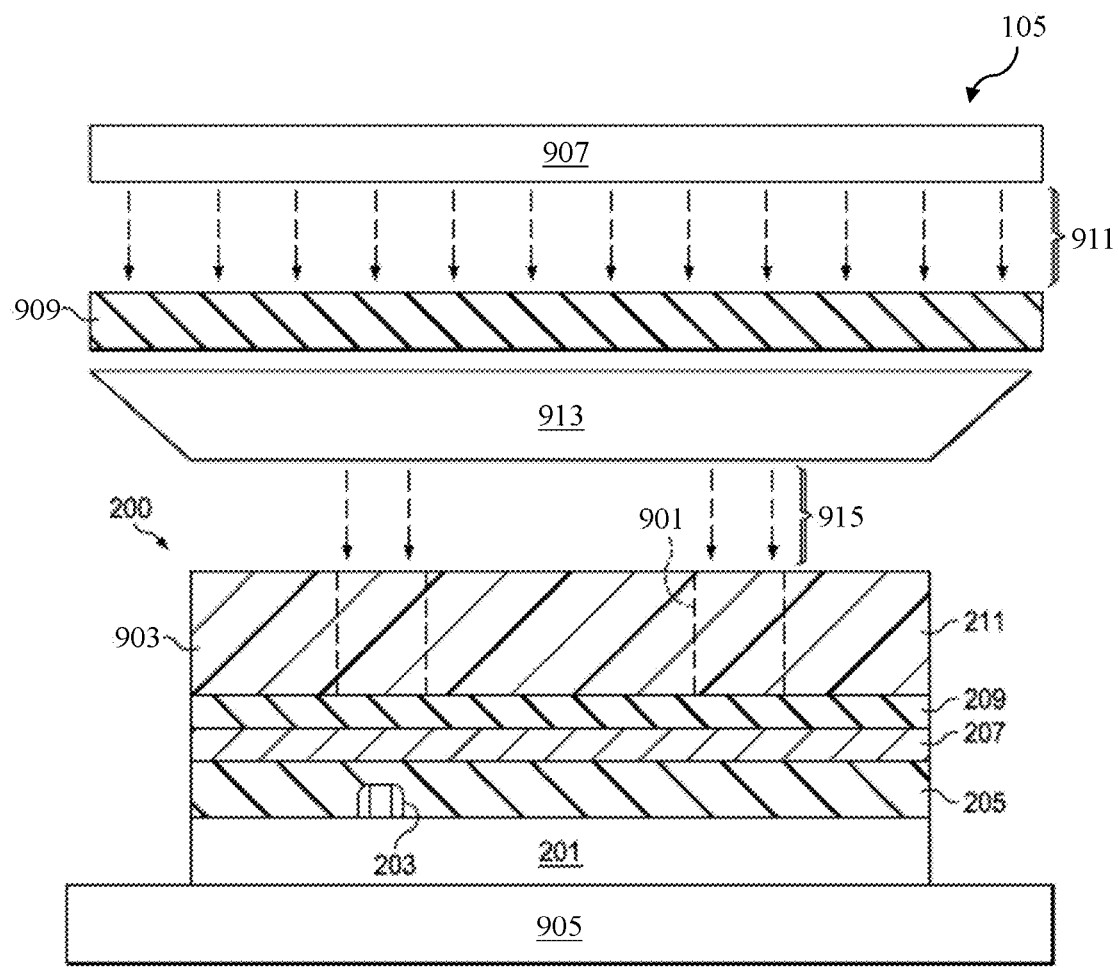
FIG. 9 illustrates an exposure of the photoresist in accordance with some embodiments.

FIG. 9 illustrates the exposure station 105 in accordance with some embodiments. In some embodiments, the substrate 201 with the photoresist 211 formed thereon is transferred (e.g., by a transfer chamber 104) into the exposure station 105 after the curing and drying of the photoresist 211 in the pre-bake station 103 (see FIG. 3). The exposure station 105 will expose the photoresist 211 to form an exposed region 901 and an unexposed region 903 within the photoresist 211. In some embodiments, the exposure station 105 may comprise a support plate 905, an energy source 907, a patterned mask 909 between the support plate 905 and the energy source 907, and optics 913. In some embodiments, the support plate 905 is a surface to which the substrate 201 with the photoresist 211 may be placed or attached to and which provides support and control to the substrate 201 during the exposure of the photoresist 211. Additionally, the support plate 905 may be movable along one or more axes, as well as providing any desired heating or cooling to the substrate 201 and photoresist 211 in order to prevent temperature gradients from affecting the exposure process.

In some embodiments, the energy source 907 supplies energy 911 such as light to the photoresist 211 in order to induce a reaction of the PACs, which in turn reacts with the polymer resin to chemically alter those portions of the photoresist 211 to which the energy 911 impinges. In some embodiments, the energy 911 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 907 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 911, such as mercury vapor lamps, xenon lamps, carbon arc lamps or the like, may alternatively be utilized.

The patterned mask 909 is located between the energy source 907 and the photoresist 211 in order to block portions of the energy 911 and to form a patterned energy 915 that actually impinging upon the photoresist 211. In some embodiments, the patterned mask 909 may comprise a series of layers (e.g., substrate, absorbance layers, anti-reflective coating layers, shielding layers, etc.) to reflect, absorb, or otherwise block portions of the energy 911 from reaching those portions of the photoresist 211 which are not desired to be illuminated. The desired pattern may be formed in the patterned mask 909 by forming openings through the patterned mask 909 in the desired shape of illumination.

Optics (represented in FIG. 9 by a trapezoid labeled 913) may be used to concentrate, expand, reflect, or otherwise control the energy 911 as it leaves the energy source 907, is patterned by the patterned mask 909, and is directed towards the photoresist 211. In some embodiments, the optics 913 comprise one or more lenses, mirrors, filters, combinations of these, or the like to control the energy 911 along its path. Additionally, while the optics 913 are illustrated in FIG. 9 as being between the patterned mask 909 and the photoresist 211, elements of the optics 913 (e.g., individual lenses, mirrors, etc.) may also be located at any location between the energy source 907 (where the energy 911 is generated) and the photoresist 211.

In some embodiments, the semiconductor device 200 comprising the substrate 201 with the photoresist 211 formed thereon is placed on the support plate 905. Once the patterned mask 909 has been aligned to the semiconductor device 200, the energy source 907 generates the desired energy 911 (e.g., light) which passes through the patterned mask 909 and the optics 913 on its way to the photoresist 211. The patterned energy 915 impinging upon portions of the photoresist 211 induces a reaction of the PACs within the photoresist 211. The chemical reaction products of the PACs' absorption of the patterned energy 915 (e.g., acids/bases/free radicals) then reacts with the polymer resin, chemically altering the photoresist 211 in those portions that were illuminated through the patterned mask 909.

Optionally, the exposure of the photoresist 211 may occur using an immersion lithography technique. In such a technique, an immersion medium (not individually illustrated in FIG. 9) may be placed between the energy source 907 (and particularly between a final lens of the optics 913) and the photoresist 211. With this immersion medium in place, the photoresist 211 may be patterned with the patterned energy 915 passing through the immersion medium.

In such embodiments, a protective layer (also not individually illustrated in FIG. 9) may be formed over the photoresist 211 in order to prevent the immersion medium from coming into direct contact with the photoresist 211 and leaching or otherwise adversely affecting the photoresist 211. In some embodiments, the protective layer is insoluble within the immersion medium, such that the immersion medium will not dissolve it and is immiscible in the photoresist 211, such that the protective layer will not adversely affect the photoresist 211. Additionally, the protective layer is transparent so that the patterned energy 915 may pass through the protective layer without hindrance.

In some embodiments, the protective layer comprises a protective layer resin within a protective layer solvent. The material used for the protective layer solvent is, at least in part, dependent upon the components chosen for the photoresist 211, as the protective layer solvent should not dissolve the materials of the photoresist 211 so as to avoid degradation of the photoresist 211 during application and use of the protective layer. The protective layer may also include additional additives to assist in such things as adhesion, surface leveling, coating, and the like.

Prior to application of the protective layer onto the photoresist 211, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 211. In some embodiments, the application may be performed using a process, such as a spin-on coating process, a dip coating method, an air-knife coating method, a curtain coating method, a wire-bar coating method, a gravure coating method, a lamination method, an extrusion coating method, combinations of these, or the like. In some embodiments, the protective layer may be applied such that it has a thickness over the surface of the photoresist 211 in a range from about 1000 nm to about 50,000 nm.

After the protective layer composition has been applied to the photoresist 211, a protective layer pre-bake may be performed in order to remove the protective layer solvent. In some embodiment the protective layer pre-bake may be performed at a temperature suitable to evaporate the protective layer solvent, such as between about 60° C. and 200° C., such as about 140° C., although the precise temperature depends upon the materials chosen for the protective layer composition. The protective layer pre-bake is performed for a time sufficient to cure and dry the protective layer composition, such as between about 10 seconds to about 10 minutes, such as about 300 seconds.

Once the protective layer has been placed over the photoresist 211, the substrate 201 with the photoresist 211 and the protective layer are placed on the support plate 905, and the immersion medium may be placed between the protective layer and the optics 913. In some embodiments, the immersion medium is a liquid having a refractive index greater than that of the surrounding atmosphere, such as having a refractive index greater than 1.

The placement of the immersion medium between the protective layer and the optics 913 may be done using, e.g., an air knife configuration of the exposure station 105, whereby fresh immersion medium is applied to a region between the protective layer and the optics 913 and controlled using pressurized gas directed towards the protective layer to form a barrier and keep the immersion medium from spreading. In such embodiments, the immersion medium may be applied, used, and removed from the protective layer for recycling so that there is fresh immersion medium used for the actual imaging process.

However, the air knife configuration for the exposure station 105 described above is not the only configuration which may be used to expose the photoresist 211 using an immersion method. Any other suitable configuration using an immersion medium, such as immersing the entire substrate 201 along with the photoresist 211 and the protective layer or using solid barriers instead of gaseous barriers may also be utilized. Any suitable method for exposing the photoresist 211 through the immersion medium may be used, and all are fully intended to be included within the scope of the embodiments.

Figure 10:
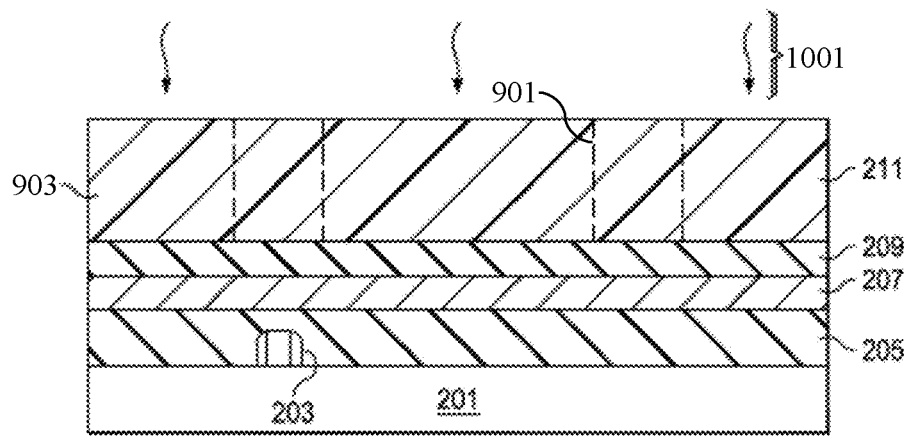
FIG. 10 illustrates a post-exposure baking of the photoresist in accordance with some embodiments.

FIG. 10 illustrates that, after the photoresist 211 has been exposed to the patterned energy 915 in the exposure station 105 (see FIG. 9), the substrate 201 with the photoresist 211 may be moved from the exposure station 105 to the post-bake station 107 (see FIG. 1) using, e.g., the transfer chamber 104. In some embodiments, the post-bake station 107 may be similar to the pre-bake station 103 described above with reference to FIGS. 3-8, and the description is not repeated herein. In other embodiments, the post-bake station 107 may be similar to the pre-bake station 103 described above with reference to FIGS. 3-8, where the first heating element 331, the second heating element 335, the third heating element 339, or the fourth heating element 341 have been omitted. However, any other suitable type of heating system, including furnaces or steam-based heating systems, may alternatively be utilized.

Once in the post-bake station 107, a post-exposure bake (PEB) (represented in FIG. 10 by the wavy lines labeled 1001) may be used in order to assist in the generating, dispersing, and reacting of the acid/base/free radical generated from the impingement of the energy 911 upon the PACs during the exposure in the exposure station 105 (see FIG. 9). Such assistance helps to create or enhance chemical reactions, which generate chemical differences and different polarities between the exposed region 901 and the unexposed region 903 within the photoresist 211. These chemical differences also cause differences in the solubility between the exposed region 901 and the unexposed region 903. In some embodiment the substrate 201 with the photoresist 211 may be placed in the post-bake station 107 and the temperature of the photoresist 211 may be increased to between about 60° C. and about 200° C. for a period of between about 10 seconds and about 600 seconds.

Returning now to FIG. 1, the photoresist track system 100 may also comprise a developer station 109 which can be used, if desired, to develop the photoresist 211. In some embodiments, the developer station 109 may be a negative tone developer, which comprises equipment and chemicals which are specific to a negative tone development process. In other embodiments, the developer station 109 may be a positive tone developer, which comprises equipment and chemicals which are specific to a positive tone development process. In some embodiments, the developer station 109 may be connected to the post-bake station 107 through, e.g., the transfer chambers 104 so that the substrate 201 with the photoresist 211 may be transferred to the developer station 109 shortly after the PEB 1001 (see FIG. 10), without breaking the interior environment of the photoresist track system 100.

Figure 11A:
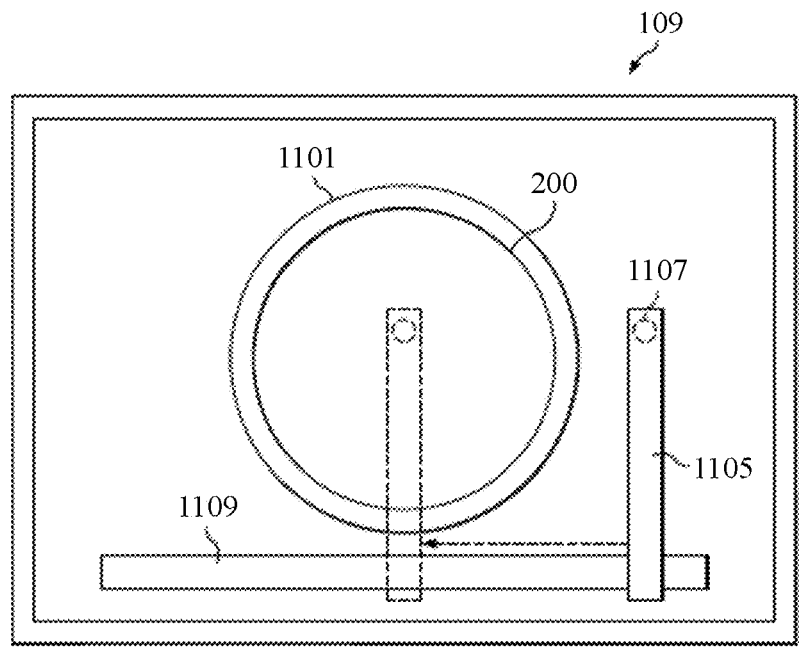
FIGS. 11A-11D illustrate a development of the photoresist in accordance with some embodiments.
Figure 11B:
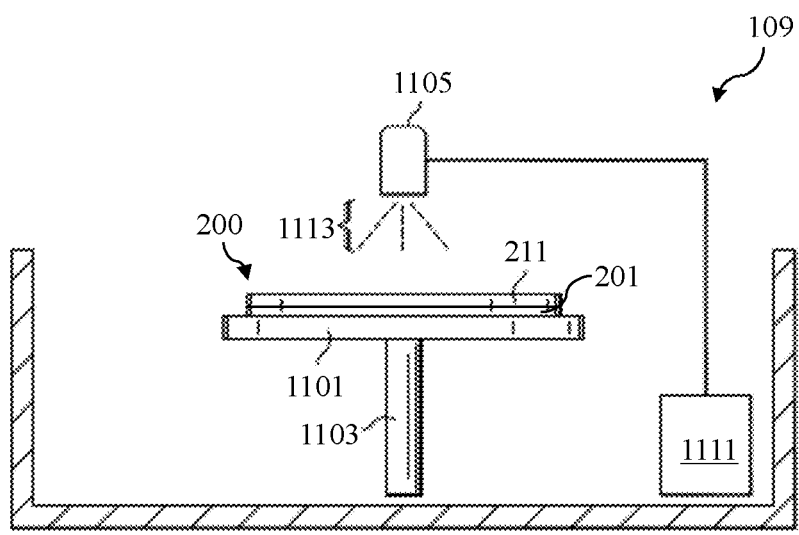

FIGS. 11A and 11B illustrate a top-down view and a representative cross-sectional view, respectively, of the developer station 109 in accordance with some embodiments. In some embodiments, the developer station 109 comprises a rotating developer chuck 1101 attached to a rotating spindle 1103. A developer dispensing arm 1105 with a developer nozzle 1107 (on a developer track 1109) is operably connected to a developer storage tank 1111 so that the developer storage tank 1111 supplies fresh developer 1113 to the developer dispensing arm 1105 and the developer nozzle 1107.

In some embodiments, the semiconductor device 200 comprising the substrate 201 with the photoresist 211 formed thereon is placed onto the rotating developer chuck 1101 and is held in place using, e.g., a vacuum pressure in embodiments in which the rotating developer chuck 1101 is a vacuum chuck. The rotating spindle 1103 to which the rotating developer chuck 1101 is attached is engaged, thereby rotating the rotating developer chuck 1101, the substrate 201, and the photoresist 211, at a speed of between about 10 rpm and about 3000 rpm. Once the substrate 201 with the photoresist 211 is rotating at the desired speed, the developer dispensing arm 1105 moves over the rotating photoresist 211 and begins to dispense the developer 1113 out of the developer nozzle 1107 at a rate of between about 0.5 cc/sec and about 20 cc/sec, at a temperature of between about 20° C. and about 35° C., such as about 23° C., for a period of time between about 10 second and about 10 minutes, such as about 2 minutes.

In some embodiment where the developer station 109 is a negative tone developer, the developer dispensing arm 1105 dispenses a negative tone developer 1113, such as a suitable organic solvent or critical fluid to remove those portions of the photoresist 211 which were not exposed to the energy and, as such, retain their original solubility. In some embodiment where the developer station 109 is a positive tone developer, the developer dispensing arm 1105 dispenses a positive tone developer 1113, such as a suitable organic solvent or critical fluid to remove those portions of the photoresist 211 which were exposed to the energy. In some embodiments in which immersion lithography is utilized to expose the photoresist 211 and a protective layer is utilized to protect the photoresist 211 from the immersion medium, the developer 1113 may be chosen to remove not only those portions of the photoresist 211 that are desired to be removed, but may also be chosen to remove the protective layer in the same development step. Alternatively, the protective layer may be removed in a separate process, such as by a separate solvent from the developer 1113 or even an etching process to remove the protective layer from the photoresist 211 prior to development.

However, while the spin-on method and configuration described herein for the developer station 109 is one suitable method for developing the photoresist 211 in the developer station 109, it is intended to be illustrative and is not intended to limit the embodiment. Rather, the developer station 109 may comprise any mechanism and chemicals in any configuration for any type of development process, include a dip process configuration, a puddle process configuration, combinations of these, or the like. All such development processes and configuration for the developer station 109 are fully intended to be included within the scope of the embodiments.

Figure 11C:
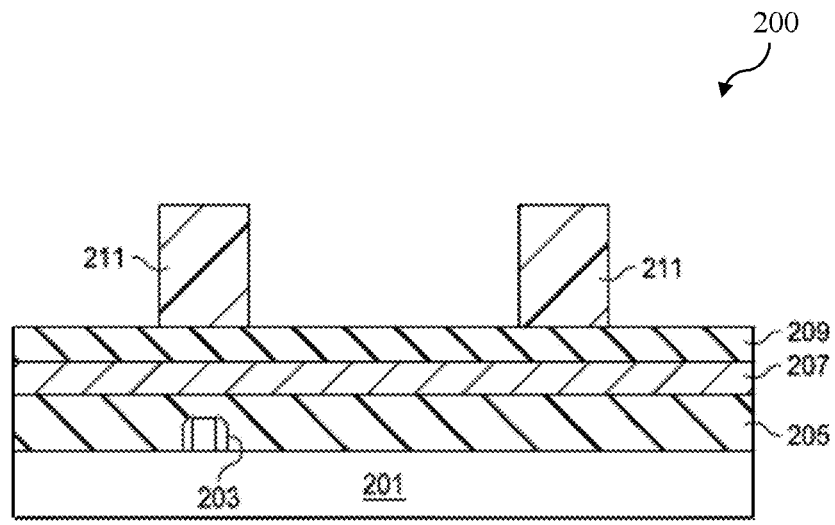

FIG. 11C illustrates a cross-sectional view of the semiconductor device 200 after performing the development process discussed above with reference to FIGS. 11A and 11B, where the developer station 109 is a negative tone developer. In some embodiments, the negative tone developer 1113 will dissolve the unexposed regions 903 of the photoresist 211 that were not exposed to the patterned energy 915 (see FIG. 9). This dissolving will leave behind the exposed regions 901 of the photoresist 211 that had been exposed to the patterned energy 915, thereby transferring the pattern of the patterned energy 915 to the photoresist 211 (see FIG. 9). Once finished, the negative tone developer 1113 may be removed by stopping the dispensing of the negative tone developer 1113 while keeping the substrate 201 spinning to remove the negative tone developer 1113 and performing an optional rinse with, e.g., deionized water.

Figure 11D:
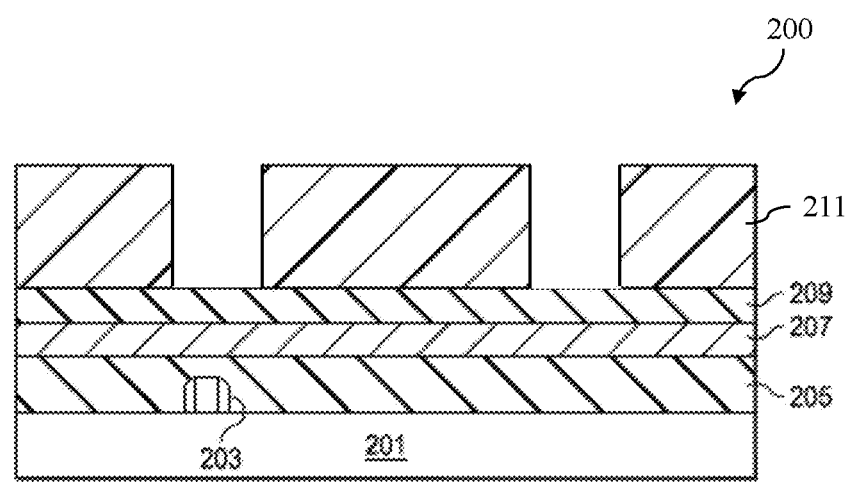

FIG. 11D illustrates a cross-sectional view of the semiconductor device 200 after performing the development process discussed above with reference to FIGS. 11A and 11B, where the developer station 109 is a positive tone developer. In some embodiments, the positive tone developer 1113 will dissolve the exposed regions 901 of the photoresist 211 that were exposed to the patterned energy 915 (see FIG. 9). This dissolving will leave behind the unexposed regions 903 of the photoresist 211 that were not exposed to the patterned energy 915, thereby transferring the pattern of the patterned energy 915 to the photoresist 211 (see FIG. 9). Once finished, the positive tone developer 1113 may be removed by stopping the dispensing of the positive tone developer 1113 while keeping the substrate 201 spinning to remove the positive tone developer 1113 and performing an optional rinse with, e.g., deionized water.

Returning now to FIG. 1, after the photoresist 211 has been developed in the developer station 109, the substrate 201 and the photoresist 211 may be moved from the developer station 109 to a hard bake station 111 using, e.g., the transfer chamber 104. Once the substrate 201 with the photoresist 211 are in position, the hard bake station 111 may optionally be used to help polymerize and stabilize the photoresist 211 after the development process, and also aid in improving the adhesion of the photoresist 211 to the target layer 209. In some embodiments, the hard bake station 111 may be similar to the pre-bake station 103 described above with reference to FIGS. 3-8, and the description is not repeated herein. In other embodiments, the hard bake station 111 may be similar to the pre-bake station 103 described above with reference to FIGS. 3-8, where the first heating element 331, the second heating element 335, the third heating element 339, or the fourth heating element 341 have been omitted. However, any other suitable type of heating system, including furnaces or steam-based heating systems, may alternatively be utilized.

In some embodiments, the substrate 201 with the photoresist 211 may be placed in the hard bake station 111 and the temperature of the photoresist 211 may be increased to between about 60° C. and about 150° C. for a period of between about 0.5 minutes and about 5 minutes. Once the hard bake has been performed on the photoresist 211, and any other processes such as rinsing or drying that may be desired, the substrate 201 with the photoresist 211 may be removed from the photoresist track system 100 through the second loadlock chamber 114. Similar to the first loadlock chamber 102, the second loadlock chamber 114 allows the substrate 201 to be removed from the photoresist track system 100 without exposing the interior stations of the photoresist track system 100 to the exterior atmosphere. Subsequently, one or more processing steps may be performed on the semiconductor device 200. In some embodiments, the target layer 209 may be etched using the patterned photoresist layer 211 (see FIGS. 11C and 11D) as an etch mask. In such embodiments, a pattern of the patterned photoresist layer 211 is transferred to the target layer 209.

Figure 12:
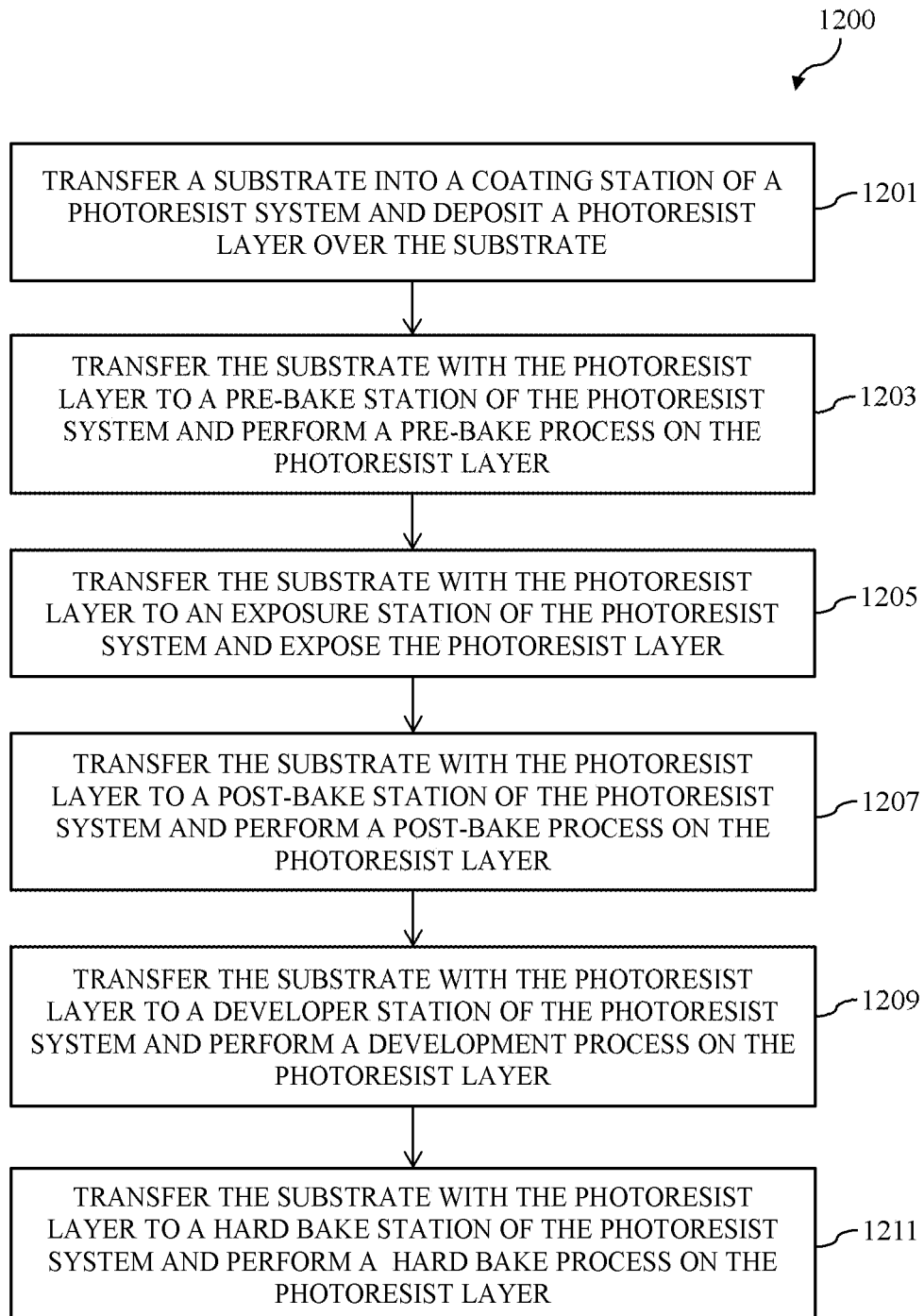
FIG. 12 is a flow diagram illustrating a method of forming of a photoresist layer in accordance with some embodiments.

FIG. 12 is a flow diagram illustrating a method 1200 of forming of a photoresist layer in accordance with some embodiments. The method starts with a step 1201, where a substrate (such as the substrate 201 illustrated in FIG. 2B) is transferred into a coating station (such as the coating station 101 illustrated in FIGS. 1 and 2A) of a photoresist system (such as the photoresist track system 100 illustrated in FIG. 1) as described above with reference to FIGS. 2A and 2B. In step 1203, the substrate with the photoresist layer is transferred to a pre-bake station (such as the pre-bake station 103 illustrated in FIGS. 1 and 3-8) and a pre-bake process is performed on the photoresist layer as described above with reference to FIGS. 3-8. In some embodiments, the pre-bake process includes setting a temperature of the photoresist layer to a first temperature using a hot-plate (such as the hot-plate 301 illustrated in FIGS. 3 and 4) of the pre-bake station, setting a temperature of the a first cover (such as the first cover 309 illustrated in FIGS. 3 and 5) of the pre-bake station to a second temperature using a first heating element (such as the first heating element 331 illustrated in FIGS. 3 and 7) of the pre-bake station, setting a temperature of the a second cover (such as the second cover 311 illustrated in FIGS. 3 and 6) of the pre-bake station to a third temperature using a second heating element (such as the second heating element 335 illustrated in FIGS. 3 and 8) of the pre-bake station, setting a temperature of the an intake pipe (such as the one or more intake pipes 319 illustrated in FIG. 3) of the pre-bake station to a fourth temperature using a third heating element (such as the third heating element 339 illustrated in FIG. 3) of the pre-bake station, and setting a temperature of the an exhaust pipe (such as the one or more exhaust pipes 321 illustrated in FIG. 3) of the pre-bake station to a fifth temperature using a fourth heating element (such as the fourth heating element 341 illustrated in FIG. 3) of the pre-bake station. In some embodiments, the second temperature, the third temperature, the fourth temperature, or the fifth temperature is greater than the first temperature. In step 1205, the substrate with the photoresist layer is transferred into an exposure station (such as the exposure station 105 illustrated in FIGS. 1 and 9) of the photoresist system and the photoresist layer is exposed as described above with reference to FIG. 9. In step 1207, the substrate with the photoresist layer is transferred into a post-bake station (such as the post-bake station 107 illustrated in FIG. 1) of the photoresist system and a post-bake process is performed on the photoresist layer as described above with reference to FIG. 10. In step 1209, the substrate with the photoresist layer is transferred into a developer station (such as the developer station 109 illustrated in FIGS. 1, 11A, and 11B) of the photoresist system and a development process is performed on the photoresist layer as described above with reference to FIGS. 11A-11D. In step 1211, the substrate with the photoresist layer is transferred into a hard bake station (such as the hard bake station 111 illustrated in FIG. 1) of the photoresist system and a hard bake process is performed on the photoresist layer as described above with reference to FIG. 1. In alternative embodiments, the step 1211 is omitted.

By utilizing the first heating element 331, the second heating element 335, the third heating element 339 and the fourth heating element 341 in the pre-bake station 103 as described above with reference to FIGS. 3-8, cold regions of the pre-bake station 103 may be reduced or eliminated. As such, a condensation of a photoresist solvent vapor on walls or other components of the pre-bake station 103 may be reduced or eliminated, defects in the photoresist may be reduced or eliminated, and a need for cleaning the pre-bake station 103 to remove the condensed solvent from the walls or other components of the pre-bake station 103 may be eliminated. This makes the overall manufacturing process cheaper and more efficient.

In accordance with an embodiment, an apparatus includes a pre-baking apparatus. The pre-baking apparatus includes: a hot-plate; a first cover over the hot-plate; a second cover over the first cover; a first heating element extending along a topmost surface of the first cover; and a second heating element extending along a topmost surface of the second cover. In an embodiment, the pre-baking apparatus further includes: an exhaust pipe connected to the second cover; and a third heating element surrounding the exhaust pipe. In an embodiment, the pre-baking apparatus further includes: an intake pipe; and a fourth heating element surrounding the intake pipe. In an embodiment, the first heating element includes a resistive material. In an embodiment, the first cover includes a plurality of first holes. In an embodiment, the first heating element includes a plurality of second holes. In an embodiment, the plurality of first holes are aligned to the plurality of second holes.

In accordance with another embodiment, an apparatus includes a pre-baking apparatus. The pre-baking apparatus includes: a hot-plate configured to raise a temperature of a wafer to a first temperature; a first cover over the hot-plate; a second cover over the first cover; a first heating element extending along a topmost surface of the first cover, the first heating element being configured to raise a temperature of the first cover to a second temperature; a second heating element extending along a topmost surface of the second cover, the second heating element being configured to raise a temperature of the second cover to a third temperature; an exhaust pipe connected to the second cover; and a third heating element extending along an outer surface of the exhaust pipe, the third heating element being configured to raise a temperature of the exhaust pipe to a fourth temperature. In an embodiment, the second temperature, the third temperature, or the fourth temperature are greater than the first temperature. In an embodiment, the pre-baking apparatus further includes: an intake pipe; and a fourth heating element extending along an outer surface of the intake pipe, the fourth heating element being configured to raise a temperature of the intake pipe to a fifth temperature. In an embodiment, the fifth temperature is greater than the first temperature. In an embodiment, the first heating element has a circular plan-view shape. In an embodiment, the second heating element has a circular plan-view shape. In an embodiment, the second heating element includes a plurality of resistive layers.

In accordance with yet another embodiment, a method includes transferring a substrate with a photoresist layer formed thereon into a pre-bake apparatus. The pre-baking apparatus includes: a hot-plate, wherein the substrate is placed on the hot-plate; a first cover over the hot-plate; a second cover over the first cover; a first heating element extending along a topmost surface of the first cover; a second heating element extending along a topmost surface of the second cover; an exhaust pipe connected to the second cover; and a third heating element extending along an outer surface of the exhaust pipe. The method further includes performing a pre-baking process on the photoresist layer using the pre-baking apparatus. The pre-baking process includes: raising, using the hot-plate, a temperature of the photoresist layer to a first temperature; raising, using the first heating element, a temperature of the first cover to a second temperature; raising, using the second heating element, a temperature of the second cover to a third temperature; and raising, using the third heating element, a temperature of the exhaust pipe to a fourth temperature. In an embodiment, the second temperature, the third temperature, or the fourth temperature are greater than the first temperature. In an embodiment, the second heating element includes a greater number of resistive layers than the first heating element. In an embodiment, the pre-baking apparatus further includes: an intake pipe; and a fourth heating element extending along an outer surface of the intake pipe. In an embodiment, the pre-baking process further includes: raising, using the fourth heating element, a temperature of the intake pipe to a fifth temperature. In an embodiment, the fifth temperature is greater than the first temperature.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a first stage, the first stage comprising:
 a hot-plate to heat a wafer that is placed on the hot-plate;
 a first cover over the hot-plate, the wafer being interposed between the hot-plate and the first cover while the wafer is placed on the hot-plate;
 a second cover over the first cover, the first cover being interposed between the wafer and the second cover while the wafer is placed on the hot-plate;
 a first heating element extending along a topmost surface of the first cover; and
 a second heating element extending along a topmost surface of the second cover.

2. The apparatus of claim 1, wherein the first stage further comprises:

an exhaust pipe connected to the second cover; and a third heating element surrounding the exhaust pipe.

3. The apparatus of claim 2, wherein the first stage further comprises:

an intake pipe; and a fourth heating element surrounding the intake pipe.

4. The apparatus of claim 1, wherein the first heating element comprises a resistive material.

5. The apparatus of claim 1, wherein the first cover comprises a plurality of first holes.

6. The apparatus of claim 5, wherein the first heating element comprises a plurality of second holes.

7. The apparatus of claim 6, wherein the plurality of first holes are aligned to the plurality of second holes.

8. An apparatus comprising:

a first stage, the first stage comprising:

a hot-plate to raise a temperature of a wafer that is placed on the hot-plate to a first temperature;

a first cover over the hot-plate, the wafer being interposed between the hot-plate and the first cover while the wafer is placed on the hot-plate;

a second cover over the first cover, the first cover being interposed between the wafer and the second cover while the wafer is placed on the hot-plate;

a first heating element extending along a topmost surface of the first cover, the first heating element being configured to raise a temperature of the first cover to a second temperature;

a second heating element extending along a topmost surface of the second cover, the second heating element being configured to raise a temperature of the second cover to a third temperature;

an exhaust pipe connected to the second cover; and a third heating element extending along an outer surface of the exhaust pipe, the third heating element being configured to raise a temperature of the exhaust pipe to a fourth temperature.

9. The apparatus of claim 8, wherein the second temperature, the third temperature, or the fourth temperature are greater than the first temperature.

10. The apparatus of claim 8, wherein the first stage further comprises:

an intake pipe; and a fourth heating element extending along an outer surface of the intake pipe, the fourth heating element being configured to raise a temperature of the intake pipe to a fifth temperature.

11. The apparatus of claim 10, wherein the fifth temperature is greater than the first temperature.

12. The apparatus of claim 8, wherein the first heating element has a circular plan-view shape.

13. The apparatus of claim 8, wherein the second heating element has a circular plan-view shape.

14. The apparatus of claim 8, wherein the second heating element comprises a plurality of resistive layers.

15. An apparatus comprising:

a first stage, the first stage comprising:

a hot-plate comprising a plurality of first heating elements and a plurality of protrusions extending from an upper side of the hot-plate, the hot-plate to heat a wafer that is placed on the plurality of protrusions;

a first cover over the hot-plate, the wafer being interposed between the hot-plate and the first cover while the wafer is placed on the plurality of protrusions, wherein the first cover comprises a plurality of first holes;

a second cover over the first cover, the first cover being interposed between the wafer and the second cover while the wafer is placed on the plurality of protrusions, wherein the second cover comprises a plurality of second holes at a center of the second cover and a plurality of grooves surrounding the plurality of second holes;

a second heating element over the first cover, wherein the second heating element comprises a plurality of third holes, wherein the plurality of third holes are aligned to the plurality of first holes; and a third heating element over the second cover, wherein the third heating element comprises a fourth hole at a center of the third heating element.

16. The apparatus of claim 15, wherein the plurality of first heating elements comprise a plurality of concentric rings in a plan view.

17. The apparatus of claim 15, wherein the plurality of first holes are arrange into a radial pattern in a plan view.

18. The apparatus of claim 15, wherein the plurality of grooves are arranged into a radial pattern in a plan view.

19. The apparatus of claim 15, wherein the plurality of grooves are disposed over the plurality of first holes.

20. The apparatus of claim 15, wherein the fourth hole is disposed over the plurality of second holes.

* * * * *